(12) United States Patent
Kuhl et al.

(10) Patent No.: US 9,509,361 B1
(45) Date of Patent: Nov. 29, 2016

(54) CAMERA-BASED ACCESSORY CLASSIFICATION

(71) Applicant: BlackBerry Limited, Waterloo (CA)

(72) Inventors: Lawrence Edward Kuhl, Waterloo (CA); Nazih Almalki, Waterloo (CA)

(73) Assignee: BlackBerry Limited, Waterloo, Ontario (CA)

( * ) Notice: Subject to any disclaimer, the term of this patent is extended or adjusted under 35 U.S.C. 154(b) by 0 days.

(21) Appl. No.: 14/933,090

(22) Filed: Nov. 5, 2015

(51) Int. Cl.
*H04M 1/00* (2006.01)
*H04B 1/3888* (2015.01)
*H04N 5/225* (2006.01)
*H05K 5/03* (2006.01)
*H05K 5/02* (2006.01)
*H05K 5/06* (2006.01)

(52) U.S. Cl.
CPC .......... *H04B 1/3888* (2013.01); *H04N 5/2252* (2013.01); *H05K 5/0247* (2013.01); *H05K 5/03* (2013.01); *H05K 5/069* (2013.01)

(58) Field of Classification Search
None
See application file for complete search history.

(56) References Cited

U.S. PATENT DOCUMENTS

| | | | | |
|---|---|---|---|---|
| 2003/0220988 A1* | 11/2003 | Hymel | ................. | G06F 13/385 709/220 |
| 2006/0173859 A1* | 8/2006 | Kim | ................. | G06F 17/30038 |
| 2008/0036898 A1* | 2/2008 | Inoue | ..................... | G03B 17/02 348/335 |
| 2009/0310177 A1* | 12/2009 | Takahashi | .......... | G03G 15/5004 358/1.15 |
| 2011/0303741 A1* | 12/2011 | Bolton | ................. | G06Q 10/087 235/375 |
| 2013/0050510 A1* | 2/2013 | Fujihashi | ............... | G03B 15/05 348/207.1 |
| 2014/0025537 A1* | 1/2014 | Venkataramu | ..... | G06Q 30/0621 705/26.61 |
| 2014/0104491 A1* | 4/2014 | Liu | ........................ | G03B 17/56 348/376 |
| 2014/0317329 A1* | 10/2014 | Barnett | ................. | G06F 1/1632 710/304 |
| 2015/0014214 A1* | 1/2015 | Richardson | ........... | G06F 1/1626 206/591 |
| 2016/0034764 A1* | 2/2016 | Connor | .............. | G06K 9/00771 348/158 |

* cited by examiner

*Primary Examiner* — Dominic Rego
(74) *Attorney, Agent, or Firm* — Rowand LLP

(57) ABSTRACT

A method for using an accessory with a mobile device is disclosed. The method includes: causing at least one camera of the mobile device to capture one or more images of a pattern disposed on a surface of an accessory that is being used with the mobile device; identifying a code associated with the accessory from the one or more images of the pattern; determining a type associated with the accessory based on the identified code; and entering an accessory-specific operating mode in which behavior of the mobile device is controlled to accommodate features that are specific to the accessory.

19 Claims, 7 Drawing Sheets

CAMERA-BASED ACCESSORY CLASSIFICATION

TECHNICAL FIELD

The present disclosure relates to mobile devices and, in particular, to methods for using a mobile device with accessories.

BACKGROUND

Mobile device users often purchase accessories, such as cases, covers and holsters, to protect their mobile devices. Mobile devices are vulnerable to physical damage, as they may be dropped or bumped against surfaces during use, resulting in broken and/or scratched screens, dented edges or damage to internal parts. Cases and covers may be useful in preventing or mitigating the effects of these types of physical damage. Device cases and covers may offer additional benefits, such as: doubling as a stand to prop up a mobile device; providing sleeves and/or pockets for holding other articles; and allowing for improved grip during use of the mobile device. A device holster may be attached to a user's belt using a clip or loop and allow a mobile device to be carried around conveniently and safely.

Manufacturers typically produce many different types of accessories for mobile devices, as consumers may have wide ranging preferences with respect to design, utility features, etc. of accessories for their mobile device. In particular, various types of cases, covers and holsters for mobile devices are commercially available.

BRIEF DESCRIPTION OF DRAWINGS

Reference will now be made, by way of example, to the accompanying drawings which show example embodiments of the present application and in which.

Like reference numerals are used in the drawings to denote like elements and features.

DETAILED DESCRIPTION OF EXAMPLE EMBODIMENTS

In one aspect, the present disclosure describes a method for using a mobile device with an accessory. The mobile device causes at least one camera associated with the mobile device to capture one or more images of a pattern disposed on a surface of an accessory that is being used with the mobile device. A code associated with the accessory is identified from the one or more captured images of the pattern and a type associated with the accessory is determined based on the identified code. The mobile device enters an accessory-specific operating mode in which the behavior of the mobile device is controlled to accommodate features that are specific to the determined accessory type.

In another aspect, the present disclosure describes a mobile device that is suitable for use with an accessory. The mobile device includes a memory, at least one camera and a display on a front surface of the mobile device. The mobile device also includes a processor that is coupled to the memory, the at least one camera and the display. The processor is configured to cause the at least one camera of the mobile device to capture one or more images of a pattern disposed on a surface of an accessory that is being used with the mobile device. A code associated with the accessory is identified by the processor from the one or more captured images of the pattern and a type associated with the accessory is determined by the processor based on the identified code. The processor of the mobile device enters an accessory-specific operating mode in which the behavior of the mobile device is controlled to accommodate features that are specific to the determined accessory type.

Other example embodiments of the present disclosure will be apparent to those of ordinary skill in the art from a review of the following detailed descriptions in conjunction with the drawings.

The present disclosure describes methods for using a mobile device with accessories that are designed for the mobile device. The accessories include features that allow a mobile device being used with the accessories to identify, among others, a type associated with the accessories. By determining the type and/or other properties associated with the accessories, the mobile device may be able to customize device behavior to suit the accessories being used. In particular, different mobile devices may be used with a single accessory, each mobile device adjusting their behavior to adapt to the features that are specific to the accessory.

Example Mobile Device

Figure 1A:
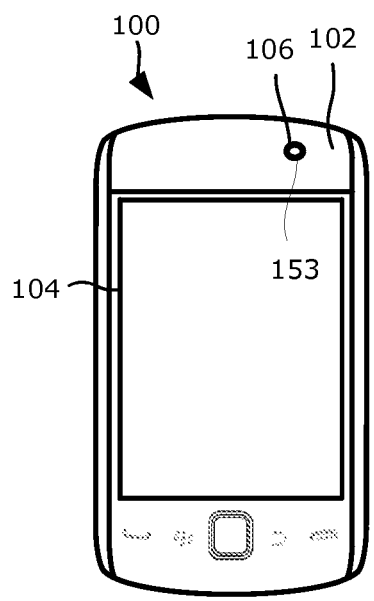
FIGS. 1A and 1B show a front view and a rear view, respectively, of an example mobile device.
Figure 1B:
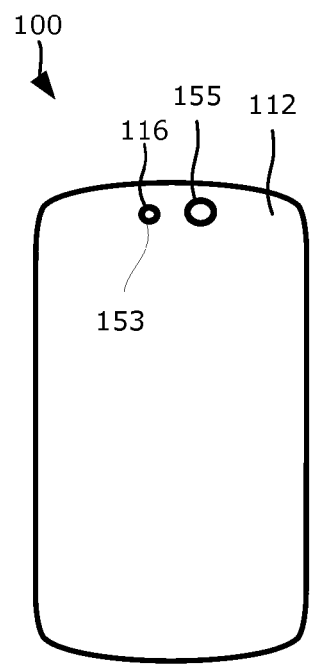

Reference is first made to FIGS. 1A and 1B, which show a front view and a rear view, respectively, of an electronic device which is, in the example, a mobile device 100. The mobile device 100 can be a mobile phone, portable computer, smartphone, tablet computer, personal digital assistant, wearable computer such as a watch, a television, a digital camera or a computer system, for example. The mobile device 100 may be of a form different from those specifically listed above.

FIG. 1A illustrates a front surface 102 of the mobile device 100. The front surface 102 is a side of the mobile device 100 which includes a display 104 that is configured to be viewed by a user of the mobile device 100. The display 104 may be a touchscreen display which acts as both an input interface (i.e. touch-sensitive overlay) and an output interface (i.e. display). The display 104 may be constructed using a touch-sensitive input surface which is connected to an electronic controller and which overlays the display 104. The touch-sensitive overlay and the electronic controller provide a touch-sensitive input interface and a processor of the mobile device 100 interacts with the touch-sensitive overlay via the electronic controller.

FIG. 1B illustrates a rear surface 112 of the mobile device 100. The rear surface 112 is a side of the mobile device 100 which does not include the main display 104. In the embodiment illustrated, the rear surface 112 is a side of the mobile device 100 which is opposite to the front surface 102 (FIG. 1A) of the mobile device 100. That is, the rear surface 112 may be substantially parallel to the front surface 102 of the mobile device 100.

The mobile device 100 includes one or more cameras 153. The cameras 153 are configured to generate camera data, such as images in the form of still photographs and/or motion video. The camera data may be captured in the form of an electronic signal which is produced by an image sensor associated with the camera 153. More particularly, the image sensor (not shown) is configured to produce an electronic signal in dependence on received light. That is, the image sensor converts an optical image into an electronic signal, which may be output from the image sensor by way of one or more electrical connectors associated with the image sensor. The electronic signal represents electronic image data (which may also be referred to as camera data).

In the embodiment illustrated, the front surface 102 includes a front facing camera 106. A front facing camera is a camera which is located to obtain images of a subject near the front surface 102 of the mobile device 100. That is, the front facing camera 106 may be generally located at or near the front surface 102 of the mobile device 100. The front facing camera 106 may be located anywhere on the front surface 102; for example, the front facing camera 106 may be located above or below the display 104. In at least some embodiments, the front facing camera 106 may be provided in a central location relative to the display 104, to facilitate image acquisition of a face. The front facing camera 106 may be used, for example, to allow a user of the mobile device 100 to engage in a video-based chat with a user of another mobile device or to capture images of the user's own face. In some embodiments, the front facing camera 106 is mounted internally within a housing of the mobile device 100, beneath a region of the front surface 102 which transmits light. For example, the front facing camera 106 may be mounted beneath a clear portion of the housing of the mobile device 100 which allows light to be transmitted to the internally mounted front facing camera 106.

Similarly, the rear surface 112 includes a rear facing camera 116. A rear facing camera 116 is a camera 153 which is located to obtain images of a subject near the rear surface 112 of the mobile device. That is, the rear facing camera may be located on or near the rear surface 112 of the mobile device 100. For example, the rear facing camera 116 may be mounted internally within a housing of the mobile device 100 beneath a region of the rear surface 112 which transmits light.

In at least some embodiments (not shown), the mobile device 100 may include both a front facing camera and a rear facing camera. The rear facing camera may obtain images which are not within the field of view of the front facing camera. The fields of view of the front facing and rear facing cameras may generally be in opposing directions.

The mobile device 100 may also have additional camera hardware to complement the cameras 153. For example, in the embodiment illustrated, the mobile device 100 includes a flash 155. The flash may, in some embodiments, be a light emitting diode (LED) flash. The flash 155 emits electromagnetic radiation and may be used to produce a brief bright light to facilitate picture-taking in low light conditions. In particular, the flash 155 may emit light while an image is captured using the camera 153. In FIG. 1B, the flash 155 is located to emit light at the rear surface 112 of the mobile device 100. That is, the flash is a rear facing flash in the illustrated embodiment. The mobile device 100 may include a front facing flash instead of or in addition to the rear facing flash to emit light at the front surface 102 of the mobile device 100.

Figure 1C:
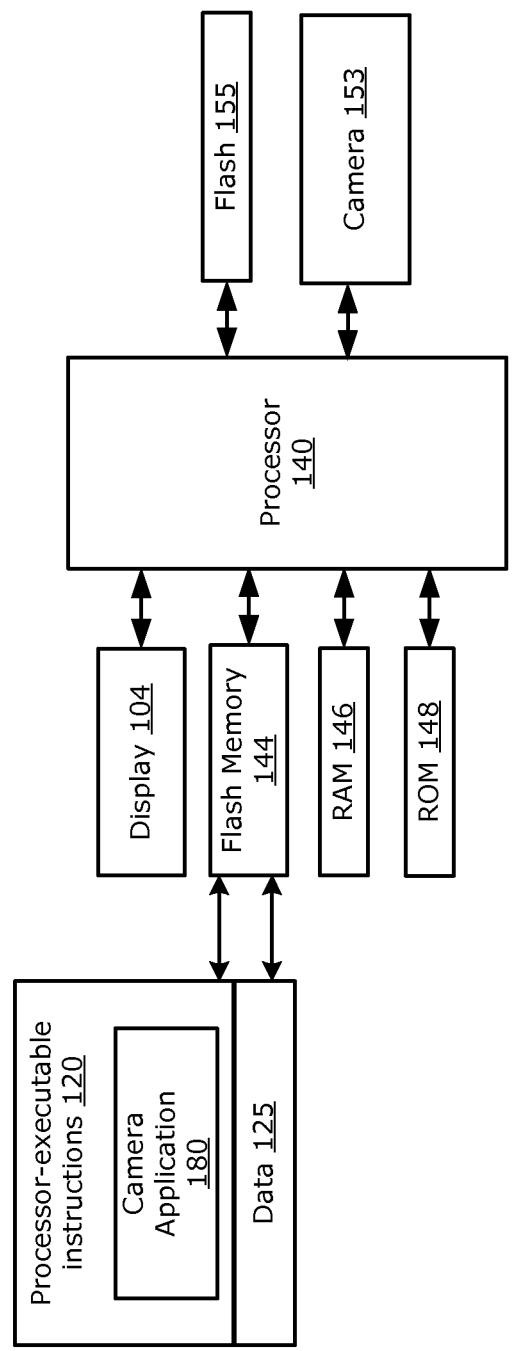
FIG. 1C is a block diagram illustrating an example mobile device in accordance with example embodiments of the present disclosure.

Reference is now made to FIG. 1C which illustrates a block diagram of components of the mobile device 100.

The mobile device 100 includes a controller including at least one processor 140 (such as a microprocessor) which controls the overall operation of the mobile device 100. The processor 140 may be communicatively coupled with device subsystems such as one or more output interfaces (such as a display 104, a flash 155 and/or a speaker), one or more input interfaces (such as a camera 153, control buttons (not shown), a touch-sensitive overlay (not shown) associated with a touchscreen display and/or other input interfaces), memory (such as flash memory 144, random access memory (RAM) 146, read only memory (ROM) 148, etc.).

The mobile device 100 stores data 125 in an erasable persistent memory, which in one example embodiment is the flash memory 144. In some embodiments, the data 125 includes images generated by the camera 153.

The processor 140 operates under stored program control and executes processor-executable instructions 120 stored in memory such as persistent memory, for example, in the flash memory 144.

The processor-executable instructions 120 or parts thereof may be temporarily loaded into volatile memory such as the RAM 146. The RAM 146 may be used for storing runtime data variables and other types of data or information, as will be apparent. Although specific functions are described for various types of memory, this is merely one example. It will be appreciated that a different assignment of functions to types of memory could also be used.

The processor 140 may be communicatively coupled to the camera 153 to allow the processor 140 to receive electronic signals representing camera data from the camera 153. The processor 140 may also be communicatively coupled to the flash 155 to allow the processor 140 to control the flash 155.

In at least some embodiments, the processor-executable instructions may include one or more camera applications 180 or software modules which are configured to control the camera 153 and the flash 155. The camera application 180 may, for example, be configured to provide a viewfinder on the display 104 by displaying, in real time or near real time, images defined in the electronic signals received from the camera 153. The camera application 180 may be configured to store the images or videos to memory, for example the flash memory 144. The images may be stored in various formats including JPEG, RAW, BMP, etc. The camera application 180 may be configured to receive data from one or more image and/or focus sensors of the camera 153 for use with autofocus methods as described herein.

The camera application 180 may, in various embodiments, determine and/or control any one or more of a number of various camera related features, options or settings including, for example, the flash 155, a digital zoom feature (which may crop an image to a centered area with the same aspect ratio as the original), an image stabilization feature, a shutter speed, a camera lens aperture, a focal length, high dynamic range settings such as a long exposure time and a short exposure time, a white balance setting and other camera configuration settings. In some embodiments, the focal length may be adjusted by lens movement. Lens movement contributes to focusing a scene or object onto an image sensor. Some of the features may be automatically determined by the camera application 180. That is, at least some of these settings may be determined without direct user input setting such settings.

While the embodiment discussed above includes a processor 140 coupled with a camera application 153 which collectively act as an image signal processor to provide image related functions, in other example embodiments (not shown), another processor such as a dedicated image signal processor, may provide some or all of these functions. That is, an image signal processor may be configured to perform the functions of the camera application 180 or a portion thereof.

For example, the camera 153 may be a digital camera provided in an integrated circuit (IC) having a memory such as Electrically Erasable Programmable Read-Only Memory (EEPROM) or flash memory, analog-to-digital (A/D) converter and a controller such as a suitably programmed microprocessor or Field Programmable Gate Array (FPGA). The IC may provide an industry standard interface such as a Serial Peripheral Interface (SPI) or Inter-Integrated Circuit (I2C) interface for connecting to a printed circuit board (PCB) of the mobile device 100. The controller provided on the IC may be configured to perform some or all of the features of the methods described herein.

Furthermore, while the camera application 180 has been illustrated as a stand-alone application, in at least some example embodiments, the functions of the camera application 180 may be provided by a plurality of software modules. In at least some example embodiments, the software modules may be divided among multiple applications.

Further, while the memory which stores the processor-executable instructions 120 has been illustrated using a block that is separate from the processor 140, in practice, the memory storing the processor-executable instructions 120 may be provided on-board the processor 140. That is, the processor 140 may include internal memory and the processor-executable instructions may be provided on the internal memory.

The mobile device 100 may include other components apart from those illustrated in FIG. 1C. By way of example, the mobile device 100 may include or be connected to a power source, such as a battery, which provides power to various components of the electronic device.

Example Protective Cover for a Mobile Device

Figure 2:
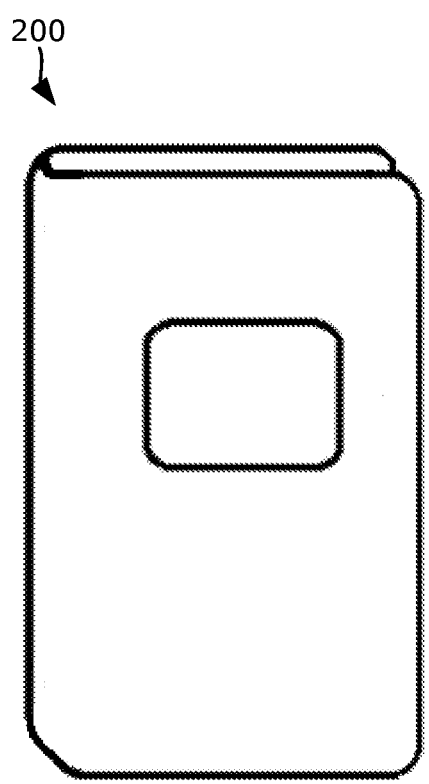
FIG. 2 shows a perspective view of an example protective cover for a mobile device.

Reference is made to FIG. 2, which shows a perspective view of an accessory. In the example, the accessory is a protective cover 200 for encasing a mobile device such as the mobile device 100 of FIGS. 1A to 1C. The protective cover 200 can provide physical protection for the mobile device and prevent or mitigate any potential damage resulting from unwanted contact with other surfaces and/or objects. In at least some embodiments, the protective cover 200 may be configured to encase the mobile device in an interior space created by the protective cover 200 in a closed position. In particular, the protective cover 200 may be sized and shaped dimensionally to cover at least portions of the front and rear surfaces of the mobile device in the closed position. For example, the protective cover 200 may cover all or substantially all of the rear surface of the mobile device as well as portions of a display on the front surface of the mobile device. The protective cover 200 may also cover parts of one or more lateral edges of the mobile device in the closed position. The closed position of the protective cover 200 will be described in greater detail below.

The protective cover 200 may be constructed from various different types of materials. For example, materials such as leather, hard rubber, plastic, silicone, fiber, fabric and metal may be used in making the protective cover 200. In at least some embodiments, different parts of the protective cover 200 may be constructed using different materials. For example, a back cover associated with the protective cover 200 may have a body composed of a combination of leather and plastic while a front cover of the protective cover 200 may be made from a durable fabric (e.g. canvas).

In at least some embodiments, the protective cover 200 may define a plurality of apertures on the body of the protective cover 200. The locations and sizes of the apertures may correspond to those of a number of external components of the mobile device when the mobile device is mounted in the protective cover 200, such components including a front facing camera, a rear facing camera, a flash lens, a speaker, a microphone and any physical function buttons. The apertures may accommodate use of functional features of a mobile device when the mobile device is mounted in the protective cover 200, eliminating the need to physically remove the mobile device from the protective cover 200 before use.

Figure 3:
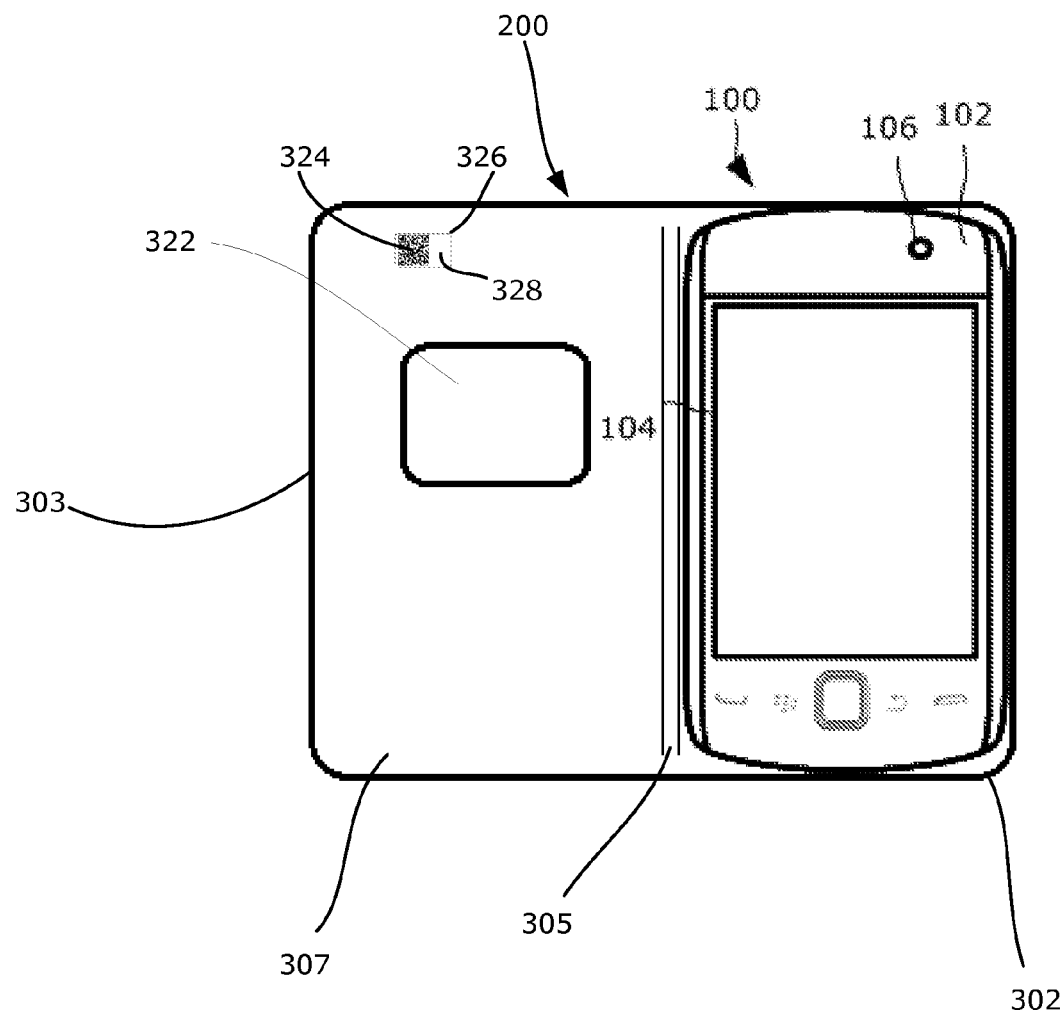
FIG. 3 shows a front view of the inside of the example protective cover of FIG. 2 in an open position, with a mobile device mounted in the protective cover.

Reference is now made to FIG. 3, which shows a front view of the inside of the protective cover 200 in an open position, with mobile device 100 mounted in the protective cover 200. The protective cover 200 includes a back cover 302. The back cover 302 is configured to cover the rear surface of a mobile device that is mounted in the protective cover 200. A first side 304 represents the inside of the back cover 302. In particular, the mobile device 100 is mounted on the first side 304 of the back cover 302 and the first side 304 supports the rear surface of the mobile device 100. In at least some embodiments, the first side 304 accommodates the shape of the rear surface of the mobile device 100. For example, the rear surface of the mobile device 100 may be generally flat or curved, and may sometimes have a number of protrusions and/or curved edges. The first side 304 of the back cover 302 may be shaped to fit over the rear surface of the mobile device 100 and conform to the shape of the rear surface.

The back cover 302 may be configured to fixedly secure the mobile device 100 to the back cover 302 when the mobile device 100 is mounted on the first side 304 of the back cover 302. In at least some embodiments, the back cover 302 may include a plurality of side walls extending from the first side 304 of the back cover 302. The side walls extend generally perpendicular to a plane of the back cover 302. The side walls may extend along the entire outer perimeter of the back cover 302 or along only portions of the perimeter. For example, a plurality of side walls may join to form at least four corner sections along the outer perimeter of the back cover 302. The inner surfaces of the side walls and the surface of the first side 304 define a recess configured to receive the mobile device 100 when the mobile device 100 is mounted on the back cover 302. In particular, the side walls may ensure that the mobile device 100 is retained in a fixed position in the recess defined by the inner surfaces of the side walls and the surface of the first side 304, by bringing the mobile device 100 into frictional contact with the inner surfaces of the side walls. The side walls may be constructed from a hard material, such as metal or polyurethane plastic, or a flexible, malleable material such as rubber or silicone.

Other techniques for securing the mobile device 100 to the back cover 302 of the protective cover 200 may be available. For example, in some embodiments, various adhesives may be used to attach the mobile device 100 to the first side 304 of the back cover 302. As a further example, the rear surface of the mobile device 100 may define a plurality of grooves and the first side 304 may include protrusions corresponding to the grooves, the protrusions being shaped to fit and be retained in the grooves.

The protective cover 200 also includes a front cover 303. The front cover 303 is configured to cover the front surface of a mobile device when the mobile device 100 is mounted on the back cover 302 of the protective cover 200. The front cover 303 includes a first side 307, which represents the inside of the front cover 303. The front cover 303 is hingedly connected to the back cover 302. More specifically, in at least some embodiments, the protective cover 200 may include a spine 305 which connects the front cover 303 and the back cover 302. The spine 305 may be attached to a first edge of the front cover 303 and a first edge of the back cover 302, the first edge of the front cover 303 being proximal to the first edge of the back cover 302 when the protective cover 200 is in an open position. The spine 305 allows hinged movement of the front cover 303 relative to the back cover 302. In particular, the front cover 303 may be folded relative to the back cover 302 such that the first side 307 of the front cover 303 is generally parallel to and faced towards the first side 304 of the back cover 302 in a closed position of the protective cover 200. The spine 305 may enable flexible hinged movement of the front cover 303 relative to the back cover 302 corresponding to, for example, varying degrees of opening (i.e. angled positions of the front cover 303 relative to the back cover 302) of the protective cover 200. The spine 305 may extend along the entire lengths of the respective edges of the front cover 303 and back cover 302 or only partially along the edges. In some other embodiments, the front cover 303 may be connected to the back cover 302 as a side flap that is hingedly attached to the back cover 302. For example, the front cover 303 may comprise a panel configured to be folded over the first side 304 of the back cover 302.

In at least some embodiments, the front cover 303 may include one or more sleeves (not shown) on the first side 307 for holding numerous different articles. For example, the sleeves of the front cover 303 may be configured to contain notes or payment cards on the inside of the protective cover 200. Furthermore, in some embodiments, at least a portion of the front cover 303 may be transparent or translucent.

The front cover 303 is hingedly connected to the back cover 302 such that the front cover 303 can be folded relative to the back cover 302 to enclose the mobile device 100 between the front cover 303 and the back cover 302 when the protective cover 200 is in a closed position. In particular, in the closed position, the front cover 303 may rest on the front surface of the mobile device 100 when the mobile device 100 is mounted on the back cover 302 such that the first side 307 is adjacent to the front surface of the mobile device.

In the example of FIG. 3, one or more apertures 322 are defined on the body of the front cover 303. The apertures 322 extend between the first side 307 and an external surface of the front cover 303. In at least some embodiments, the apertures 322 allow at least a portion of the front surface of a mobile device mounted in the protective cover 200 to be visible when the protective cover 200 is in the closed position. In particular, a user of a mobile device that is mounted in the protective cover 200 may be able to view portions of a display 104 on the front surface of the mobile device when the protective cover 200 is closed. In some cases, the protective cover 200 may include one or more transparent touchscreens or windows that are sized to be retained in the apertures 322 defined on the front cover 303. For example, the touchscreens may accommodate capacitive sensing and conduct any detected touches to the display of the mobile device when the protective cover 200 is in the closed position.

The front cover 303 includes a pattern 324 that is disposed on the first side 307. The pattern 324 is located on the first side 307 such that at least a portion of the pattern 324 aligns with a front facing camera 106 of the mobile device 100 when the protective cover 200 is in the closed position. In at least some embodiments, the pattern 324 may be positioned on the first side 307 such that the pattern 324 is located within the field of view of the front facing camera 106 in the closed position. In particular, the position of the pattern 324 facilitates capturing an image of the pattern 324 by the front facing camera 106 of the mobile device 100. For example, in the example of FIG. 3, the front facing camera 106 is located above the display on the front surface 102 of the mobile device 100. The front cover 303 of the protective cover 200 defines an aperture 322 through which a portion of the display of the mobile device can be viewed, and the pattern 324 is located above the aperture 322 on the first side 307 of the front cover 303.

Since the location of the front facing camera may vary across different devices, the pattern 324 may be repeated on the first side 307 of the front cover 303. Many smartphones and tablet computers are designed to include a front facing camera above a display screen on the front surface. The pattern 324 may be positioned at a plurality of different locations near the top edge of the front cover 303 such that an image of the pattern 324 may be captured by a front facing camera on multiple different mobile devices. For example, the pattern 324 may be repeated horizontally in a periodic manner on the first side 307 of the front cover 303, each location of the pattern 324 being in spaced relation to an adjacent location of the pattern 324.

The pattern 324 may encode various different types of information about the protective cover 200. In at least some embodiments, the pattern 324 may encode information regarding a type associated with the protective cover 200. For example, the pattern 324 may correspond to a code indicating whether the protective cover 200 is of a type of protective cover having a windowed aperture on the front cover for viewing portions of the display of an encased mobile device. As another example, the pattern 324 may be a code indicating whether the protective cover is compatible with other accessories for a mobile device, such as a portable stand or wireless charging pad.

In some embodiments, the code represented in the pattern 324 may indicate one or more physical properties associated with the front cover 303. As explained above, the front cover 303 may define a plurality of apertures through which portions of the front surface of a mounted mobile device are visible. In particular, portions of the display of the mobile device may be viewed through one or more apertures on the front cover 303. Rather than turning off the display 104 of the mobile device 100 entirely when the protective cover 200 is in a closed position, it may be desirable to display information on portions of the display 104 that align with apertures 322 of the front cover 303 in the closed position. By way of example, even when the protective cover 200 is closed, encasing a mobile device between the front cover 303 and the back cover 302, a user of the mobile device may wish to be able to view certain information, such as the current time, newly received notifications, calendar event reminders, etc., through the apertures 322 on the front cover 303. On the other hand, however, presenting a display of information on the entire display of the mobile device when the protective cover 200 is in the closed position would result in unwanted consumption of battery power. As the display of information on the display is controlled by the mobile device, in order to limit the display of information only to those portions of the display that are viewable through the apertures 322 in the closed position of the protective cover 200, it may be useful to specify to the processor of the mobile device certain physical properties associated with the apertures 322.

The use of a pattern 324 may be one possible way of indicating to the mobile device one or more physical properties associated with the aperture 322 on the front cover 303. For example, the pattern 324 may encode information regarding the location, size, shape or orientation of any of the apertures 322. In particular, the information relating to the location, size, etc. of the apertures 322 may be specified relative to the dimensions of a mobile device that is configured to be fixedly secured to the back cover 302 of the protective cover 200. For example, the location and size information for the apertures 322 may be described relative to the dimensions of a mobile device that can fit inside and be retained in a recess defined by side walls and the first side 304 of the back cover 302.

In at least some embodiments, the pattern 324 may be an alphanumeric code. In some other embodiments, the pattern 324 may include a barcode. For example, the pattern 324 may be a two-dimensional or matrix barcode, such as a Quick Response (QR) code. In yet further embodiments, the pattern 324 may include one or more distinct shapes. In some cases, the pattern 324 may be machine-readable only and invisible to the human eye. Additionally, the pattern may comprise one or more apertures positioned in a predetermined area on the first side 307 of the front cover 303. Other variations of the pattern 324 may be used for the protective cover 200.

The protective cover 200 may be configured to facilitate capturing images of the pattern 324 by a front facing camera of a mobile device that is mounted in the protective cover 200. For example, in some embodiments, the side walls may be of such height as to support the front cover 303 and maintain the first side 307 of the front cover 303 in spaced relation from the front surface of the mobile device 100 when the protective cover 200 is in the closed position. In particular, the height of the side walls may be greater than the height (i.e. thickness) of a mobile device mounted in the protective cover 200. The space between the front surface of the mobile device 100 and the first side 307 of the front cover 303 may ensure that an image can be captured by the front facing camera 106.

Additionally, in some embodiments, the front cover 303 may define one or more light-transmitting apertures near or on a portion of the front cover 303 on which the pattern 324 is disposed, in order to let in sufficient amount of light for the front facing camera 106 of the mobile device 100 to be able to capture an image of the pattern 324. In some embodiments, the one or more light-transmitting apertures may be defined in the vicinity of the pattern 324 on the front cover 303 and/or on a portion of the front cover 303 that aligns directly with the front facing camera 106 of the mobile device 100 in the closed position. For example, the light-transmitting apertures may be defined on the front cover 303 within 1 centimeter of the pattern 324.

In at least some embodiments, the protective cover 200 may include a label 326 which is attached to the first side 307 of the front cover 303. In particular, a first side of the label 326 may be affixed to the first side 307 of the front cover 303. The second side 328 of the label 326 may contain the pattern 324. That is, the position of the label 326 on the first side 307 is such that at least a portion of the pattern 324, disposed on the second side 328 of the label 326, aligns with the front facing camera 106 of the mobile device 100 when the mobile device 100 is mounted in the protective cover 200 is in the closed position.

The pattern 324 itself may facilitate image capture by the front facing camera 106 in the closed position. In at least some embodiments, the pattern 324 may be printed using colors that are easily detectable in images even in low light settings. For example, the colors of the ink used for the pattern 324 may be selected as to contrast starkly with the colors of the second side 328 of the label 326 and/or the first side 307 of the front cover 303. In some cases, the pattern 324 may be printed using fluorescent colored ink.

Method for Using a Mobile Device with an Accessory

Figure 4:
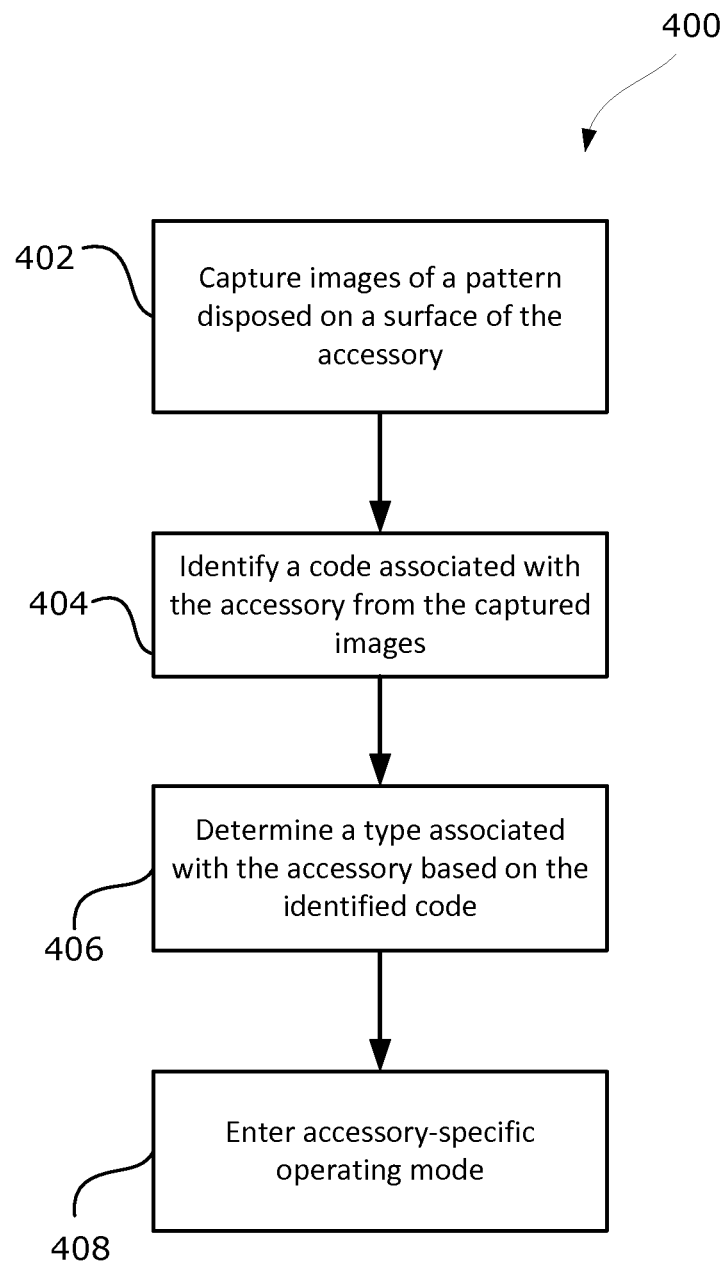
FIG. 4 shows, in flowchart form, an example method for using a mobile device with an accessory in accordance with example embodiments of the present disclosure.

Reference is now made to FIG. 4, which shows, in flowchart form, an example method 400 for using a mobile device with an accessory. In at least some embodiments, the method 400 may be performed by a processor of the mobile device. In particular, in some embodiments, processor-executable instructions 120, such as the camera application 180, may configure the processor to perform the method 400. The accessory may be a case or cover designed to attach to, support or hold the mobile device. For example, the accessory may be a shell, holster, pouch or sleeve sized to contain the mobile device and provide a measure of protection for the mobile device. As another example, the accessory may be a protective cover of the type described above with reference to FIGS. 2 and 3. In some embodiments, the method 400 may be performed with other types of accessories such as, for example, portable stands or charging pads.

In operation 402, the mobile device causes a camera on the mobile device to capture one or more images of a pattern disposed on a surface of the accessory. The mobile device may have both a front facing camera and a rear facing camera and, so, the images of the pattern may be captured using one or both of the cameras. In at least some embodiments, the one or more cameras of the mobile device may capture images of the pattern upon detecting that a predetermined condition is satisfied. By way of example, the cameras may be activated to begin capturing images after the mobile device detects that it is in a predefined physical position with respect to the accessory. For example, in response to detecting that the mobile device is partially or completely encased in the accessory, the mobile device may cause the cameras to start capturing images. As another example, the cameras may be activated when the mobile device detects that the accessory is within a certain proximity of the mobile device or that the accessory and the mobile device are in physical contact with each other.

Once the images of the pattern are obtained by the mobile device, in operation 404, a code associated with the accessory may be identified from the images. The identified code may encode various details regarding the accessory such as physical features, type, model, etc. In particular, in operation 406, the mobile device determines a type associated with the accessory based on the identified code. The "type" associated with an accessory may refer to the identity of the accessory itself (e.g. whether the accessory is a case, shell, holster, etc.) or may specify certain properties about the accessory. For example, the "type" may identify one or more properties that are unique to a specific accessory. The mobile device may therefore be able to distinguish between different types of accessories as well as between different models/ versions/sizes/etc. of the same type of accessory for the mobile device, based on analyzing the code identified from the images of the pattern.

In at least some embodiments, the mobile device may, at operation 406, access a database containing listings of a plurality of codes associated with various different accessories and the "types" corresponding to the codes. For example, the database may include all of the codes associated with accessories that are known to be designed and manufactured for the mobile device. By comparing the code identified from the images of the pattern to codes found in the database, the mobile device may be able to determine the type associated with the accessory.

When the type associated with the accessory is determined, the mobile device enters an accessory-specific operating mode, in operation 408. In the accessory-specific operating mode, the behavior of the mobile device may be controlled to accommodate features that are specific to the determined accessory type. That is, according to method 400, even without an explicit instruction from a user of the mobile device, the mobile device may automatically enter a mode in which its behavior adjusts to facilitate use with a specific accessory. The accessory-specific operating mode may cause various different changes to be effected to the behavior of the mobile device. For example, the changes in device behavior may relate to display of information on the mobile device, battery power consumption level, notification settings, etc. Examples of accessory-specific operating mode will be provided in greater detail below.

Figure 5:
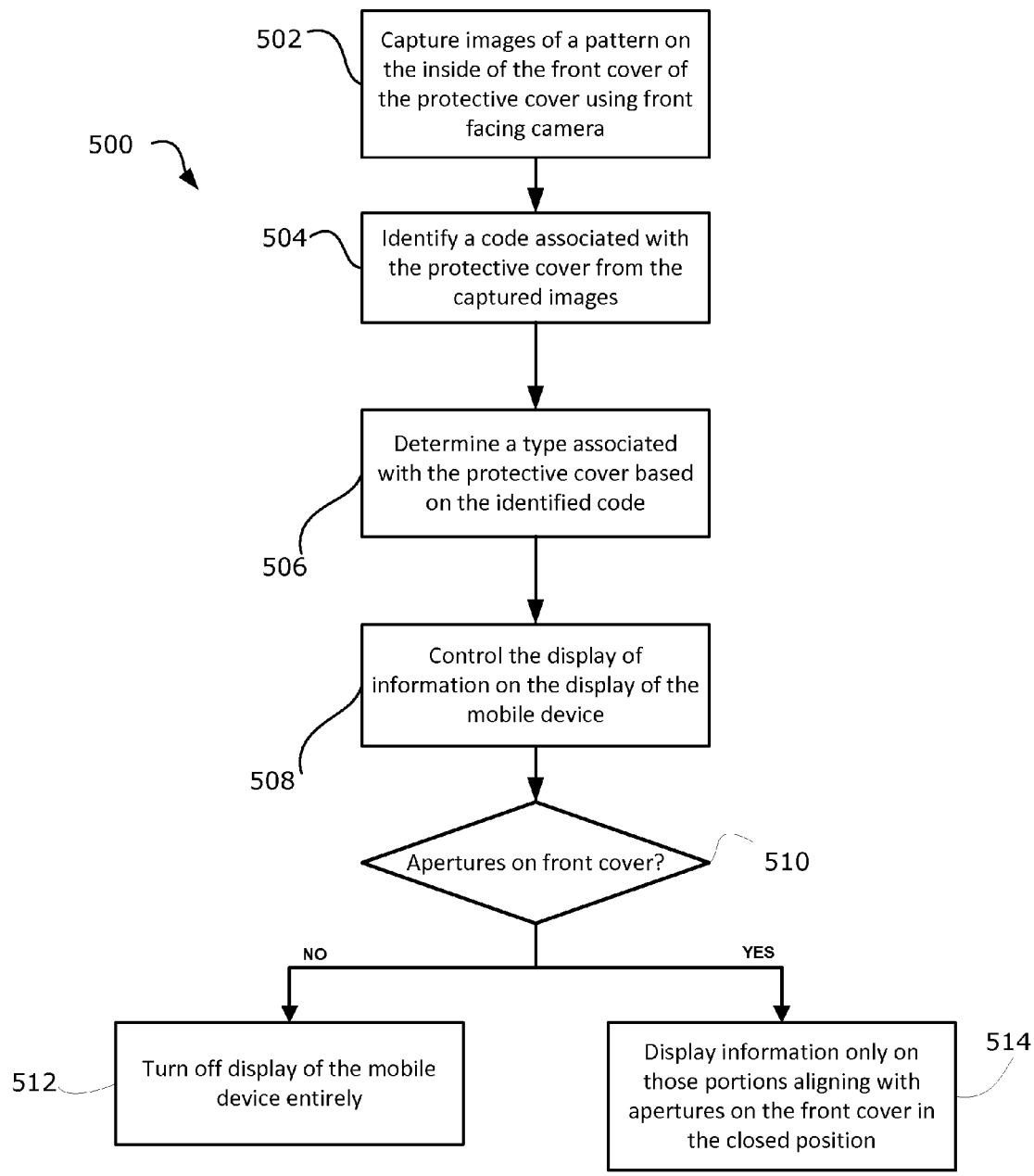
FIG. 5 shows, in flowchart form, an example method for using a mobile device with the example protective cover of FIG. 2 in accordance with example embodiments of the present disclosure.

Reference is now made to FIG. 5, which shows, in flowchart form, an example method 500 for using a mobile device with a protective cover. In at least some embodiments, the method 500 may be performed by a processor of the mobile device. For example, the method 500 may be performed by a mobile device that is suitable for use with a protective cover such as the protective cover 200 of FIGS. 2 and 3. In particular, in some embodiments, processor-executable instructions 120, such as the camera application 180, may configure the processor of the mobile device to perform the method 500.

The mobile device may first detect that a protective cover covering at least portions of the mobile device is in a closed position. As explained above, the closed position of a protective cover corresponds to a position in which the inside of the front cover is generally parallel to and faced opposite the inside cover of the back cover of the protective cover. When the mobile device is mounted on and secured to the back cover, the front cover may lie directly over the mobile device, with the inside of the front cover being adjacent to the front surface of the mobile device.

The detection of a closed position of the protective cover may be achieved in a number of different ways. For example, the mobile device may employ a proximity detection technique for determining whether the protective cover is closed. The mobile device may include a proximity detection subsystem comprising at least one electromagnetic radiation (EMR) source and at least one EMR detector, the source and the detector both being coupled to the processor of the mobile device. The proximity detection subsystem may be controlled by one or a combination of a monitoring circuit, a control circuit and operating software of the mobile device. The EMR source can be configured to emit EMR from the mobile device and the EMR detector may detect incident EMR to generate and output an electrical signal representative of the detected EMR. The EMR source and the EMR detector may be positioned on the front surface of the mobile device such that EMR emitted from the mobile device may be reflected by objects within close proximity of the front surface back towards the EMR detector. The mobile device may interpret the detected EMR patterns and the timing of these patterns to determine a distance of an object from which the EMR signals were reflected. In particular, when the protective cover is approaching a closed position (i.e. as the front cover is being closed over the mobile device), the distance between the front surface of the mobile device and the front cover of the protective cover will gradually decrease until reaching a minimum in the closed position. Accordingly, the mobile device may determine that the protective cover is in the closed position based on readings from the proximity detection subsystem and the changes in distance inferred between the mobile device and the front cover.

In some embodiments, the mobile device may include an ambient light sensor near or on the front surface of the mobile device. The ambient light sensor may be used for enabling automatic control of display backlight brightness over a wide range of lighting conditions. That is, depending on the ambient lighting conditions, the brightness of the display may be increased or decreased, to improve visibility and/or reduce power consumption. When the protective cover is in or approaching the closed position, the ambient light sensor of the mobile device may detect low light level since the front cover is gradually brought over to cover the light sensor. Therefore, sensor readings corresponding to very low ambient light levels may indicate to the mobile device that the protective cover is in a closed position.

In some other embodiments, the mobile device may additionally include a Hall Effect sensor that is configured for proximity switching, positioning and speed detection based on changes to a magnetic field near the mobile device. A Hall Effect sensor is a transducer that can vary an output voltage in response to an ambient magnetic field. If the front cover of the protective cover encasing the mobile device includes an embedded magnet, the Hall Effect sensor of the mobile device may be able to detect the proximity of the magnet as the front cover is closed and the protective cover approaches a closed position.

Upon determining that the protective cover is in or approaching the closed position, the mobile device may cause the front facing camera on the front surface of the mobile device to capture one or more images. That is, in operation 502, the front facing camera of the mobile device may obtain images of the pattern disposed on the inside of the front cover of the protective cover. In at least some embodiments, the front facing camera may be activated as the front cover is being closed in order to capture a sequence images during a closing movement of the front cover. Greater amount of light may reach the front surface of the mobile device during the closing movement of the front cover as compared to when the protective cover is in a completely closed position and, so, the capture of images prior to the protective cover reaching a closed position may facilitate acquiring clearer images of the pattern on the front cover. In some embodiments, the front facing camera of the mobile device may capture images at regular intervals of time, which may allow the mobile device to determine whether the protective cover is maintained in a closed position. For example, the front facing camera may be configured to obtain camera data at predetermined time intervals after the first time of detecting that the protective cover is in the closed position.

In operation 504, the mobile device analyzes the acquired images of the pattern to identify a code associated with the protective cover. The one or more images of the pattern may depict the entirety of the code or a substantial portion of the code to enable identification of the code. That is, the portions of the code shown in the images of the pattern are sufficient to identify the code associated with the protective cover.

In operation 506, the mobile device determines a type associated with the protective cover based on the identified code. In particular, in at least some embodiments, the mobile device may detect one or more physical properties associated with the front cover of the protective cover. For example, in at least some embodiments, the mobile device may determine that the front cover defines one or more apertures through which at least a portion of the front surface of the mobile device is visible in the closed position. The apertures may allow a user of the mobile device to view portions of a display on the front surface of the mobile device when the front cover is closed over the mobile device. The code may represent information regarding the one or more apertures defined on the front cover, such as shape, shape and location. Other information may also be encoded in or determined from the code, including: orientations of the apertures; whether capacitive touchscreens or windows are fitted in the apertures; which of the apertures are suitable for displaying only and which are suitable for touch-based interaction, etc.

In response to determining the type associated with the protective cover, in operation 508, the mobile device may control a display of information on the display. For example, the mobile device may determine whether the front cover defines apertures thereon, in operation 510. If the mobile device determines that the front cover does not include any apertures, when the protective cover is in the closed position, the mobile device may turn off the display entirely, in operation 512. Since a front cover without apertures would not provide visibility of the display, the display may be turned off to save power consumption while the protective cover is closed. For example, even if a display time-out period has not elapsed since the mobile device was last left idle, upon determining that there are no apertures on the front cover, the display may be turned off at the time the mobile device detects that the front cover is closed. If, on the other hand, the mobile device determines that the front cover does include one or more apertures, the mobile device may cause a display information on only those portions of the display that align with the apertures of the front cover when the protective cover is in the closed position, in operation 514. In particular, the portions of the display aligning with the apertures of the front cover when the front cover is closed may contain a display of information while the remainder of the display may be turned off. For example, when the protective cover is closed, graphical user interfaces associated with various notifications, reminders or other information (e.g. current time/date, weather, device status such as remaining battery level and wireless connectivity, etc.) may be displayed on the portions of the display that align with the one or more apertures on the front cover. Such displaying may allow a user of the mobile device to view relevant information through the apertures on the front cover even when the protective cover is closed, while also providing the benefits of reduced consumption of battery power by cutting back the use of covered portions of the display.

Figure 6:
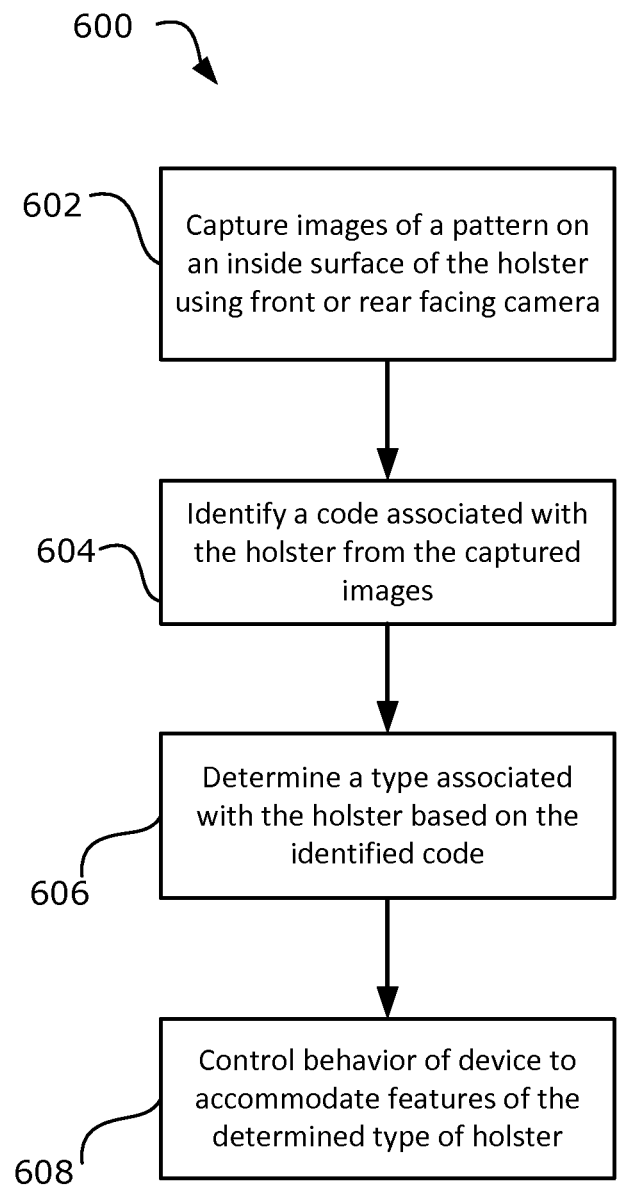
FIG. 6 shows, in flowchart form, an example method for using a mobile device with an example holster in accordance with example embodiments of the present disclosure.

Reference is now made to FIG. 6, which shows, in flowchart form, an example method 600 for using a mobile device with an example holster. In at least some embodiments, the method 600 may be performed by a processor of the mobile device. For example, the method 600 may be performed by a mobile device that is suitable for use with a holster. In particular, in some embodiments, processor-executable instructions 120, such as the camera application 180, may configure the processor of the mobile device to perform the method 600.

A holster for a mobile device is a case for carrying the mobile device. In at least some embodiments, a holster may include a belt with loops or slots for carrying the mobile device. The holster has a first inner surface and a second inner surface. When the mobile device is inserted in the holster, the front and rear surfaces of the mobile device may be in physical contact with the first inner surface and the second inner surface. In operation 602, one or both of front facing camera and a rear facing camera of the mobile device may be used to capture images of a pattern on one of the inside surfaces of the holster. More specifically, in at least some embodiments, a pattern may be disposed on the first inner surface of the holster such that at least a portion of the pattern aligns with the front facing camera when the mobile device is fully inserted in the holster, allowing images of the pattern to be captured by the front facing camera. Similarly, in some embodiments, a pattern may be disposed on the second inner surface such that at least a portion of the pattern aligns with the rear facing camera when the mobile device is fully inserted in the holster, and the rear facing camera may capture images of the pattern.

Just as in method 400, the mobile device identifies a code associated with the holster from the captured images of the pattern in operation 604. Once the code is identified, the mobile device determines, in operation 606, that the accessory is a holster and/or determines a type associated with the holster based on the identified code. The mobile device controls device behavior to accommodate features of the determined type of holster, in operation 608. For example, in at least some embodiments, the mobile device may turn off all or parts of its display and/or be put in a power saving mode in operation 608.

As noted above, images of a pattern on surfaces of an accessory may be used for identifying a type associated with the accessory. In some embodiments, as previously mentioned, the pattern may be represented as one or more apertures on a surface of the accessory. For example, variations in size, number and positioning of one or more apertures on a surface may be used as a pattern for uniquely identifying an accessory and/or a type associated with an accessory.

The various embodiments presented above are merely examples and are in no way meant to limit the scope of this application. Variations of the innovations described herein will be apparent to persons of ordinary skill in the art, such variations being within the intended scope of the present application. In particular, features from one or more of the above-described example embodiments may be selected to create alternative example embodiments including a sub-combination of features which may not be explicitly described above. In addition, features from one or more of the above-described example embodiments may be selected and combined to create alternative example embodiments including a combination of features which may not be explicitly described above. Features suitable for such combinations and sub-combinations would be readily apparent to persons skilled in the art upon review of the present application as a whole. The subject matter described herein and in the recited claims intends to cover and embrace all suitable changes in technology.

The invention claimed is:

1. A method implemented by a processor of a mobile device, the mobile device having at least one camera and a display on a front surface of the mobile device, the method comprising:
   causing the at least one camera to capture one or more images of a pattern disposed on a surface of an accessory that is being used with the mobile device;
   identifying a code associated with the accessory from the one or more images of the pattern;
   determining a type associated with the accessory based on the identified code; and
   entering an accessory-specific operating mode in which behavior of the mobile device is controlled to accommodate features that are specific to the determined accessory type.

2. The method of claim 1, wherein the accessory is a protective cover for the mobile device, the protective cover having a front cover that covers a front surface of the mobile device when the protective cover is in a closed position.

3. The method of claim 2, wherein the at least one camera is a front facing camera of the mobile device and wherein the pattern is disposed on a first side of the front cover such that at least a portion of the pattern aligns with the front facing camera when the protective cover is in the closed position, the first side being adjacent to the front surface of the mobile device in the closed position.

4. The method of claim 3, wherein determining a type associated with the accessory based on the identified code comprises determining that the front cover defines one or more apertures through which at least a portion of the front surface of the mobile device is visible in the closed position.

5. The method of claim 4, wherein determining that the front cover defines one or more apertures comprises determining at least one of a size, a shape and a location associated with each of the one or more apertures on the front cover.

6. The method of claim 4, wherein entering the accessory-specific operating mode comprises displaying information on only those portions of the display that align with the one or more apertures of the front cover when the protective cover is in the closed position.

7. The method of claim 1, wherein the accessory is a holster for the mobile device, the holster having a first inner surface and a second inner surface.

8. The method of claim 7, wherein the at least one camera includes a front facing camera on a front surface of the mobile device and wherein the pattern is disposed on the first inner surface such that at least a portion of the pattern aligns with the front facing camera when the mobile device is fully inserted in the holster.

9. The method of claim 7, wherein the at least one camera includes a rear facing camera on a rear surface of the mobile device and wherein the pattern is disposed on the second inner surface such that at least a portion of the pattern aligns with the rear facing camera when the mobile device is fully inserted in the holster.

10. The method of claim 1, wherein the pattern comprises at least one of:
    a barcode;
    an alphanumeric code;
    a shape; and
    one or more apertures positioned in a predetermined area on the surface.

11. The mobile device of claim 1, wherein the accessory is a holster for the mobile device, the holster having a first inner surface and a second inner surface.

12. The mobile device of claim 11, wherein the at least one camera includes a front facing camera on a front surface of the mobile device and wherein the pattern is disposed on the first inner surface such that at least a portion of the pattern aligns with the front facing camera when the mobile device is fully inserted in the holster.

13. The mobile device of claim 11, wherein the at least one camera includes a rear facing camera on a rear surface of the mobile device and wherein the pattern is disposed on the second inner surface such that at least a portion of the pattern aligns with the rear facing camera when the mobile device is fully inserted in the holster.

14. A mobile device, comprising:
    a memory;
    at least one camera;
    a display on a front surface of the mobile device;
    a processor coupled to the memory, the at least one camera and the display, the processor being configured to:
       cause the at least one camera to capture one or more images of a pattern disposed on a surface of an accessory that is being used with the mobile device;
       identify a code associated with the accessory from the one or more images of the pattern;
       determine a type associated with the accessory based on the identified code; and
       enter an accessory-specific operating mode in which behavior of the mobile device is controlled to accommodate features that are specific to the determined accessory type.

15. The mobile device of claim 14, wherein the accessory is a protective cover for the mobile device, the protective cover having a front cover that covers a front surface of the mobile device when the protective cover is in a closed position.

16. The mobile device of claim 15, wherein the at least one camera is a front facing camera of the mobile device and wherein the pattern is disposed on a first side of the front cover such that at least a portion of the pattern aligns with the front facing camera when the protective cover is in the closed position, the first side being adjacent to the front surface of the mobile device in the closed position.

17. The mobile device of claim 16, wherein determining a type associated with the accessory based on the identified code comprises determining that the front cover defines one or more apertures through which at least a portion of the front surface of the mobile device is visible in the closed position.

18. The mobile device of claim 17, wherein determining that the front cover defines one or more apertures comprises determining at least one of a size, a shape and a location associated with each of the one or more apertures on the front cover.

19. The mobile device of claim 17, wherein entering the accessory-specific operating mode comprises displaying information on only those portions of the display that align with the one or more apertures of the front cover when the protective cover is in the closed position.

* * * * *